(12) United States Patent
Sakayori et al.

(10) Patent No.: US 6,864,699 B2
(45) Date of Patent: Mar. 8, 2005

(54) APPARATUS FOR TESTING INTEGRATED CIRCUITS HAVING AN INTEGRATED UNIT FOR TESTING DIGITAL AND ANALOG SIGNALS

(75) Inventors: Hiroshi Sakayori, Sagamihara (JP); Takanori Komuro, Tokyo (JP)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/807,948

(22) Filed: Mar. 24, 2004

(65) Prior Publication Data

US 2004/0178816 A1 Sep. 16, 2004

Related U.S. Application Data

(62) Division of application No. 10/054,139, filed on Jan. 22, 2002, now Pat. No. 6,737,881.

(30) Foreign Application Priority Data

Mar. 30, 2001 (JP) .......................................... 2001-98038

(51) Int. Cl.[7] ............................................... G01R 31/26
(52) U.S. Cl. ..................... 324/763; 324/765; 324/73.1; 714/724
(58) Field of Search ........................ 324/73.1, 763–765, 324/158.1; 714/719, 724, 735–736, 740

(56) References Cited

U.S. PATENT DOCUMENTS 4,583,223 A * 4/1986 Inoue et al. ................. 714/724
4,929,888 A * 5/1990 Yoshida ...................... 714/736

FOREIGN PATENT DOCUMENTS

| DE | 33 04 283 | 10/1983 |
| DE | 199 56 533 | 5/2000 |
| DE | 100 17 622 | 11/2000 |
| EP | 0 984 291 | 3/2000 |

OTHER PUBLICATIONS

"Dynamic Test System for High Speed Mixed Signal Devices," by Kiyo Hiwada and Toshio Tamamura, 1987 International Test Conference, IEEE, pp. 370–375. (translated), (no month).

Nikkei Electronic, No. 453, pp. 216–221, Aug. 8, 1988. (not translated).

* cited by examiner

Primary Examiner—Minh N. Tang

(57) ABSTRACT

An apparatus for testing digital and analog signals from an integrated circuit includes an adder or subtractor 17 for being supplied with an analog signal outputted from the integrated circuit of a device under test and a signal outputted from a driver 11, an integrator 14 for being supplied with an analog signal outputted from the adder or subtractor 17, a switch 22 for selectively transmitting an analog signal outputted from the integrator 14 and a digital signal outputted from the integrated circuit to the comparator 13, and a switch 24 for selectively transmitting a signal outputted from a memory 20 and a signal outputted from a comparator 13 to the driver 11. At least one of the switches 22, 24 is operated depending on whether a signal to be tested is analog or digital.

4 Claims, 10 Drawing Sheets

APPARATUS FOR TESTING INTEGRATED CIRCUITS HAVING AN INTEGRATED UNIT FOR TESTING DIGITAL AND ANALOG SIGNALS

This application is a division of U.S. patent application Ser. No. 10/054,139 filed on Jan. 22, 2002, now U.S. Pat. No. 6,737,881.

BACKGROUND OF THE INVENTION

1. Field of the Invention

The present invention relates to an apparatus for testing an integrated circuit (hereinafter referred to as "IC"), and more particularly to an apparatus for testing an IC which comprises both digital and analog circuit components.

2. Description of the Related Art

One conventional IC testing apparatus is shown in FIG. 7 of the accompanying drawings. As shown in FIG. 7, the conventional IC testing apparatus has a power supply 1, a controller 2, a time-based synchronizing system 3 for synchronizing various measuring components with a given timing signal, and a device interface 4 for connecting the measuring components to an IC device under test. The conventional IC testing apparatus also has, as its measuring components, a digital I/O device (often a plurality of digital I/O devices) 5 for exchanging digital signals with a digital signal terminal of the IC device under test to determine whether the IC device under test is acceptable or not, an audio-band AWG (Arbitrary Waveform Generator) 6 and a video-band AWG 7 for applying known signals to an analog signal input terminal of the IC device under test, and an audio-band digitizer 8 and a video-band digitizer 9 for detecting a signal from an analog signal output terminal of the device under test to determine whether the IC device under test is acceptable or not. The conventional IC testing apparatus may have a plurality of AWGs and a plurality of digitizers having different bands and different resolutions depending on the signal frequency that is handled and the required level of accuracy.

For testing an IC device, the conventional IC testing apparatus applies a predetermined signal to the IC device under test, and compares an output signal from the IC device under test with an expected value. For testing an IC which comprises both digital and analog circuit components, it is necessary to perform a digital output test using a digital comparator and an analog output test using an analog comparator.

Specifically, a digital test signal generated by a digital signal generator is applied to the IC under test, and an analog signal outputted from the IC under test is converted by an analog-to-digital converter into numerical data, which is stored in a capture memory. Thereafter, a processor processes the numerical data stored in the capture memory to calculate parameters necessary to evaluate analog output characteristics of the IC under test, and determines whether the IC under test is acceptable or not using the parameters. A digital signal outputted from the IC under test is compared with a value expected from an acceptable IC by a digital signal evaluation apparatus to determine whether the IC under test is acceptable or not.

According to the above conventional process, different testing units are used to test digital and analog output signals from an IC which comprises both digital and analog circuit components. Therefore, it is necessary to test such an IC with two testers, i.e., a digital IC tester and an analog IC tester, or a single large-scale IC tester comprising digital and analog test circuits.

Conventionally, the test system needs to have optimum test devices for handling respective attributes (e.g., digital and analog natures, frequency bands, resolutions, etc.) of a signal applied to or outputted from a device under test. Furthermore, testing a variety of devices requires a number of test devices having different performances to be available on hand.

In each test, the test device must be connected to corresponding terminals of the device under test. Such connections may need to be changed depending on the item to be measured. Changing connections makes the test time-consuming because it causes mechanical connectors such as relays to be turned on and off. Since terminal layouts of devices under test generally differ from device to device, it is necessary to prepare connecting jigs dedicated for the respective devices under test.

According to the recent trends of multifunctional ICs, there is a growing number of ICs in which a large-scale digital circuit and a simple analog circuit are integrated. Preparing a large-scale analog testing circuit for use with ICs comprising digital and analog circuit components makes the cost of testing ICs high.

SUMMARY OF THE INVENTION

It is an object of the present invention to provide an apparatus of simple structure which has functions and performances that have been carried out by a plurality of conventional testing apparatuses.

According to the present invention, there is provided an apparatus for testing an integrated circuit in analog and digital components of a device under test by monitoring an analog signal and a digital signal outputted from the integrated circuit, comprising a comparator, a memory for receiving an output signal from the comparator, a driver for receiving an output signal from the memory, an adder or subtractor which may accept an analog signal outputted from the integrated circuit and a signal outputted from the memory, an integrator which accepts an analog signal outputted from the adder or subtractor, a first switch for selectively transmitting an analog signal outputted from the integrator and a digital signal outputted from the integrated circuit to the comparator, and a second switch for selectively transmitting a signal outputted from the memory and a signal outputted from the comparator to the driver, wherein at least one of the switches is operated depending on whether a signal to be tested from the integrated circuit of the device under test is an analog signal or a digital signal. The apparatus may further comprise a third switch and a digital filter which are connected between the comparator and the memory, for transmitting the signal outputted from the comparator selectively via the digital filter to the memory.

The present invention also provides an apparatus for testing an integrated circuit in analog and digital components of a device under test by monitoring an analog signal and a digital signal outputted from the integrated circuit, comprising a comparator, a memory for receiving an output signal from the comparator, a driver for receiving an output signal from the memory, an adder or subtractor which may accept an analog signal outputted from the integrated circuit and a signal outputted from the driver, an integrator which accepts an analog signal outputted from the adder or subtractor, a first switch for selectively transmitting an analog signal outputted from the integrator and a digital signal outputted from the integrated circuit to the comparator, and a second switch for selectively transmitting a signal outputted from the memory and a signal outputted from the comparator to the driver, wherein at least one of the switches is operated depending on whether a signal to be tested from the integrated circuit of the device under test is an analog signal or a digital signal. This apparatus may also further comprise a third switch and a digital filter which are connected between the comparator and the memory, for transmitting the signal outputted from the comparator selectively via the digital filter to the memory. The apparatus may further comprise a delay circuit connected between the comparator and the adder or the subtractor. The apparatus may further comprise a delay circuit connected between the comparator and the second switch. In the apparatus, the driver may be disposed in a feedback loop extending from the comparator to the adder or the subtractor.

The testing apparatus according to the present invention can test a plurality of items without changing connections between itself and the integrated circuit under test. If integrated circuits to be tested have terminals at identical positions, then the testing apparatus can test different integrated circuits without changing connections. The testing apparatus can thus test integrated circuits at a reduced test cost.

While it has generally been practiced to input a digital signal to and output a digital signal from one apparatus, the present invention makes it possible for one testing apparatus to input and output a digital signal and also to input and output an analog signal. The digital and analog signal inputting and outputting capability unifies the components enclosed by the dotted line in FIG. 7, i.e., the digital I/O 5, the audio-band AWG 6, the video-band AWG 7, the audio-band digitizer 8, and the video-band digitizer 9.

DETAILED DESCRIPTION OF THE PREFERRED EMBODIMENTS

Figure 7:
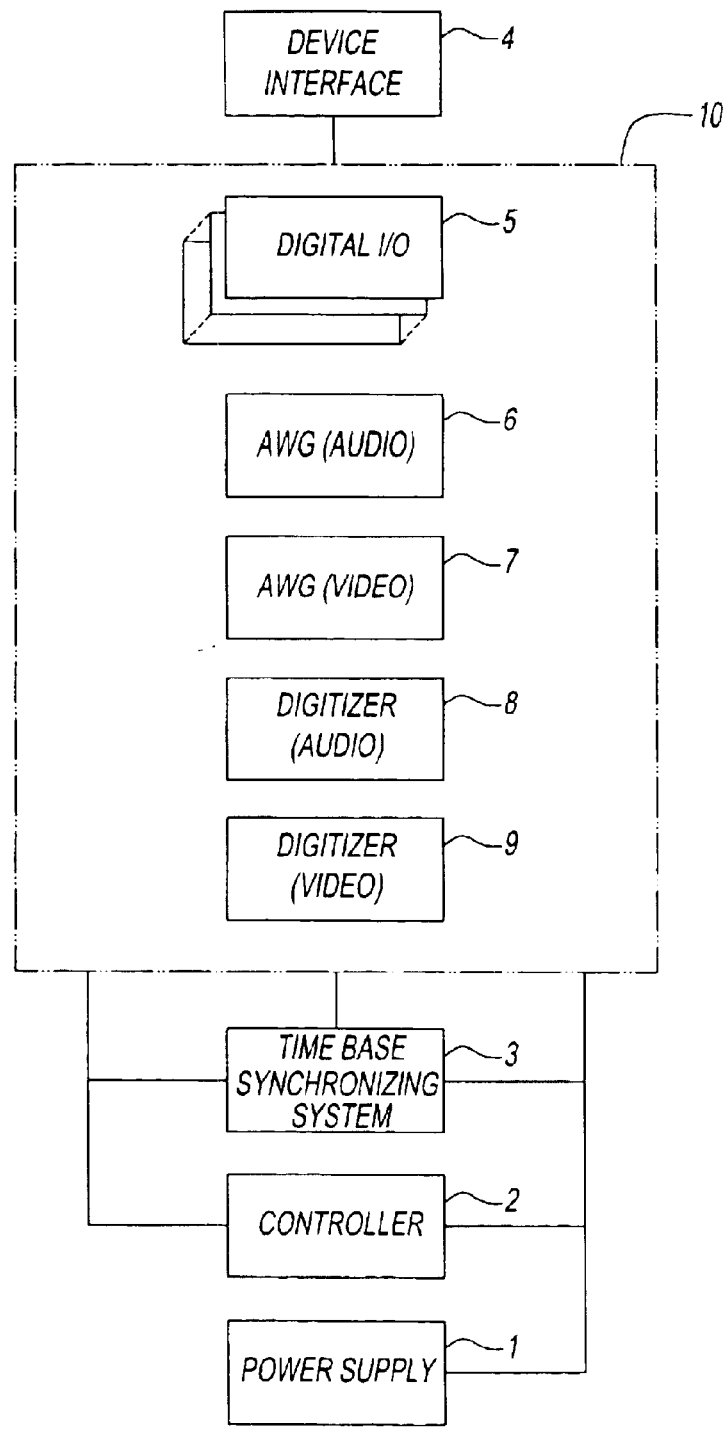
FIG. 7 is a block diagram of a conventional IC testing system, which includes a section enclosed by the dot-and-dash line and a digital I/O channel that are to be implemented by a single piece of hardware according to the present invention.

It should be understood that the power supply 1, the controller 2, the time-based synchronizing system 3 for synchronizing various measuring components with a given timing signal, and the device interface 4 for connecting the measuring components to an IC device under test, of the conventional IC testing apparatus shown in FIG. 7 can also be used in the present invention.

A measuring system according to a first embodiment of the present invention will be described below with reference to FIGS. 1(a) and 1(b). A basic arrangement of the measuring system will be described below with reference to FIGS. 1(a) and 1(b). First, a signal output section of the measuring system will be described below with reference to FIG. 1(a). The signal output section includes a driver 11 for being supplied with a controller output signal for determining an output level, a test vector for performing a digital test, and a bit stream for performing an analog test, and an analog filter (low-pass filter) 12 for being supplied with one of two divided output signals from the driver 11. For outputting a digital signal, the signal output section uses one of the two divided signals from the driver 11, the one which directly outputs signals without the analog filter 12. Depending on the controller output signal, the driver 11 either outputs a binary signal, which is high or low, or cuts off its output signal to provide a high-impedance mode. For outputting an analog signal, the signal output section supplies one of two divided output signals from the driver 11 to the analog filter 12 to operate the analog filter as a $\Delta\Sigma$ D/A converter. At this time, the data rate and the cutoff frequency of the analog filter 12 are controlled to provide a D/A converter having a plurality of frequency bands and resolutions.

A signal input section of the measuring system will be described below with reference to FIG. 1(b). The signal input section includes a comparator 13 for comparing a digital input signal and a reference level signal from a threshold controller, an integrator 14, a delay circuit 15 for delaying an output signal from the comparator 13 by a predetermined time, a digital filter 16, and an adder 17. For detecting the level of the digital input signal, the digital input signal and the reference level signal from the threshold controller are compared with each other by the comparator 13. The comparator 13 outputs a compared result to a memory 20, which stores the compared result. For measuring an analog input signal, the signal input section connects the integrator 14 and the delay circuit 15 to the comparator 13 to operate them as a $\Delta\Sigma$ A/D converter. A digital waveform which is converted by the comparator 13 is supplied via the digital filter 16 to the memory 20, which stores the digital waveform. At this time, the time constant of the integrator 14 and the clock frequency and cutoff frequency of the digital filter 16 are controlled to provide an A/D converter having a plurality of frequency bands and resolutions.

Figure 1A:
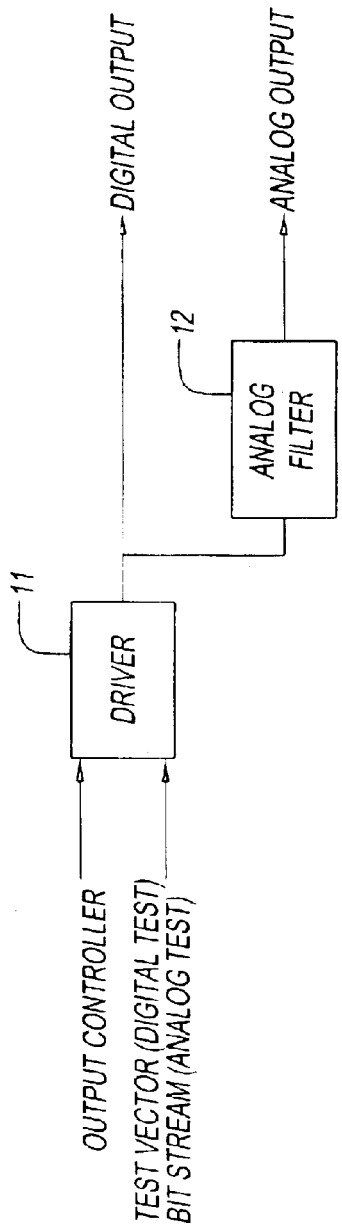
FIGS. 1(a) and 1(b) are block diagrams showing a measuring system for testing analog and digital input signals and analog and digital output signals according to a first embodiment of the present invention.
Figure 1B:
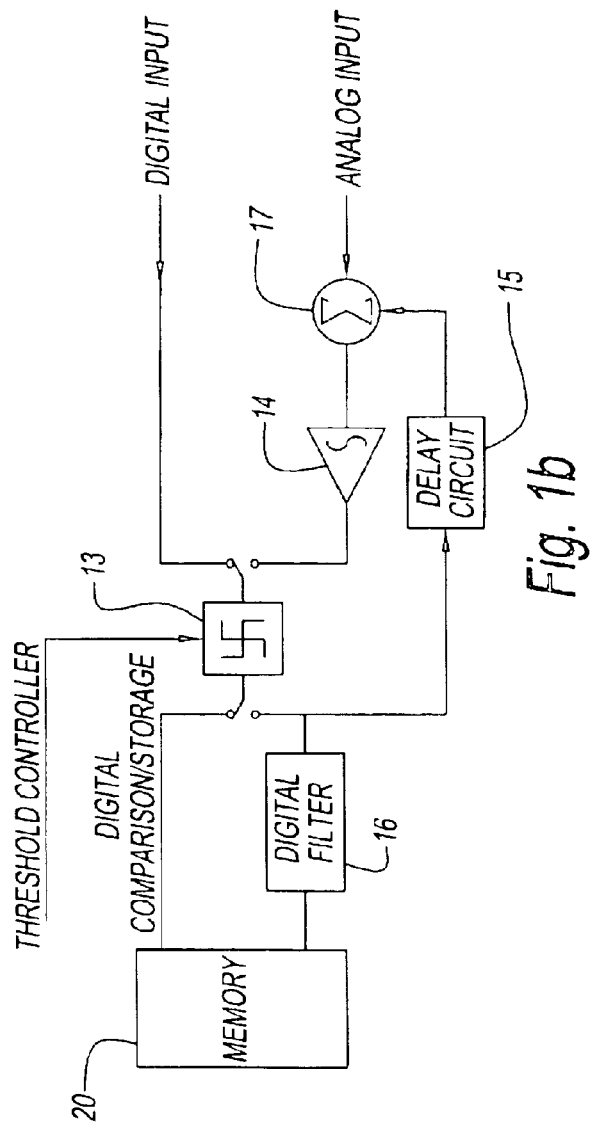
Figure 2:
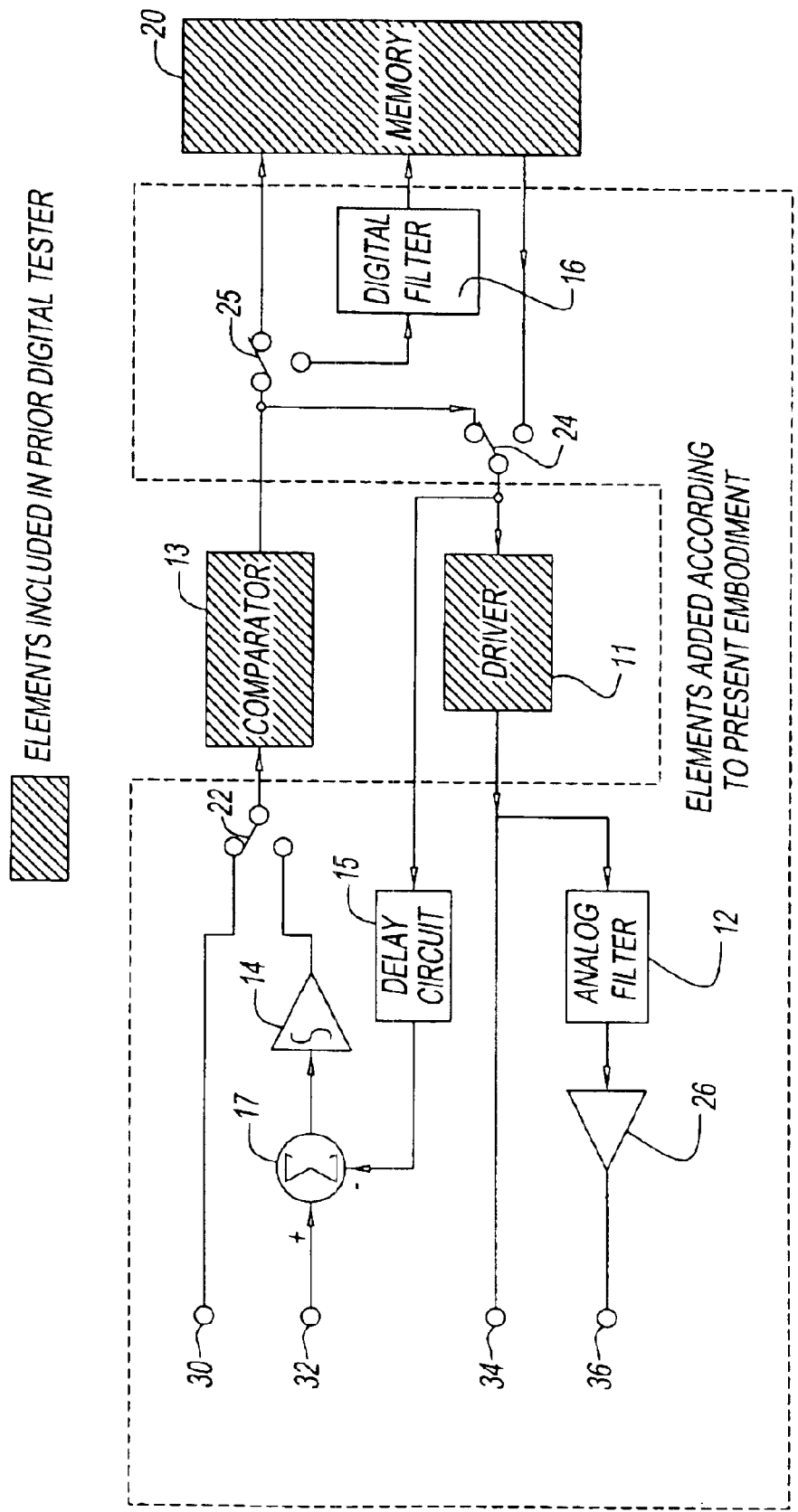
FIG. 2 is a block diagram of an overall IC tester of the measuring system shown in FIG. 1.

The signal output section shown in FIG. 1(a) and the signal input section shown in FIG. 1(b) are combined with each other into an IC tester according to the present invention as shown in FIG. 2. Those components enclosed by the dotted line are added according to the present invention, whereas the driver 11, the comparator 13, and the memory 20, which are shown hatched, are components that are used in a conventional digital tester.

Figure 3:
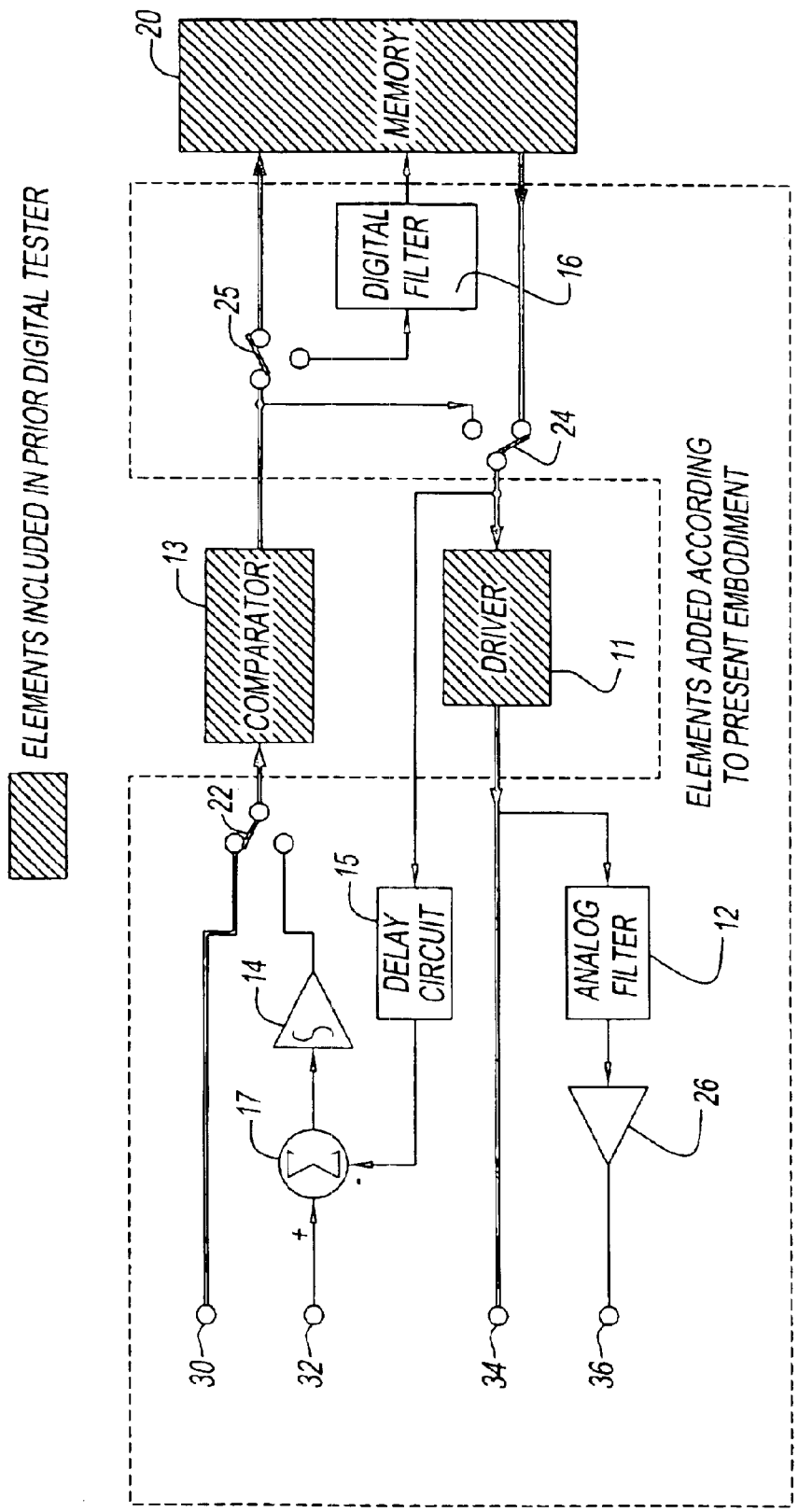
FIG. 3 is a block diagram showing the manner in which the measuring system shown in FIG. 2 operates when a digital signal is inputted thereto and outputted therefrom.

Operation of the IC tester according to the present invention when a digital signal is inputted thereto and outputted therefrom will be described below with reference to FIG. 3.

First, switches 22, 24 are operated to supply a digital output signal from an IC device under test from a digital input terminal 30 via the comparator 13 to the memory 20. The digital output signal and a value expected from an acceptable IC device are compared with each other by a digital signal determining unit (not shown) to determine whether the IC device under test is acceptable or not. For outputting a digital signal, test data stored in the memory 20 is outputted via the switch 24 and the driver 11 to a digital output terminal 34.

Figure 4:
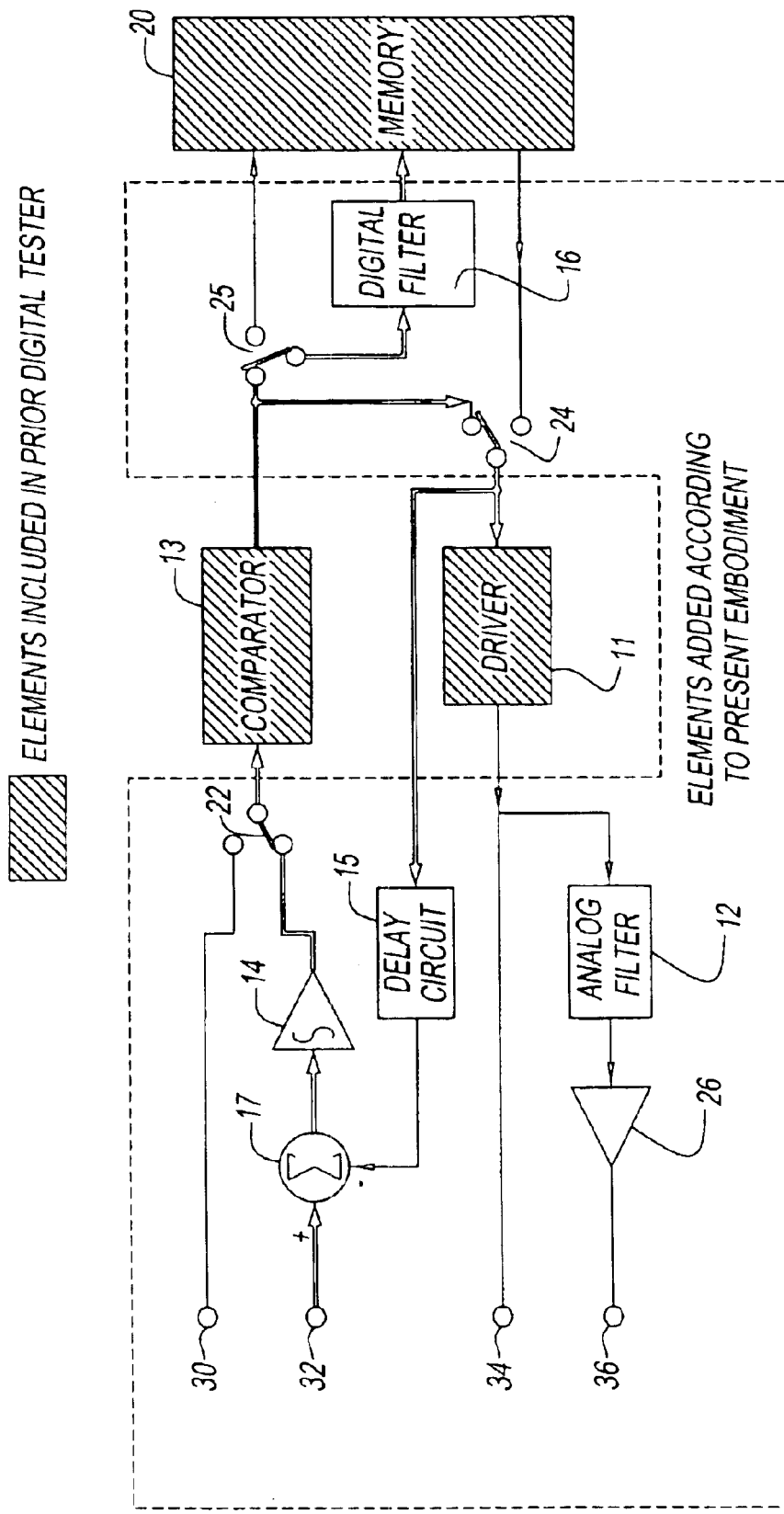
FIG. 4 is a block diagram showing the manner in which the measuring system shown in FIG. 2 operates when an analog signal is inputted thereto.

Operation of the IC tester according to the present invention when an analog signal is inputted thereto and outputted therefrom will be described below with reference to FIGS. 4 and 5. When an analog input signal is supplied from an IC device under test to the IC tester, as shown in FIG. 4, the analog input signal is transmitted from an analog input terminal 32 via the adder 17 and the integrator 14 to the switch 22. The switch 22 and a switch 25 are operated to transmit the analog input signal via the comparator 13 and the digital filter 16 to the memory 20. The switch 24 is operated to transmit an analog output signal branched from the comparator 13 through a feedback loop via the delay circuit 15 to the adder 17. The feedback loop including the integrator 14 and the adder 17 provides a ΔΣ A/D converter.

Figure 5:
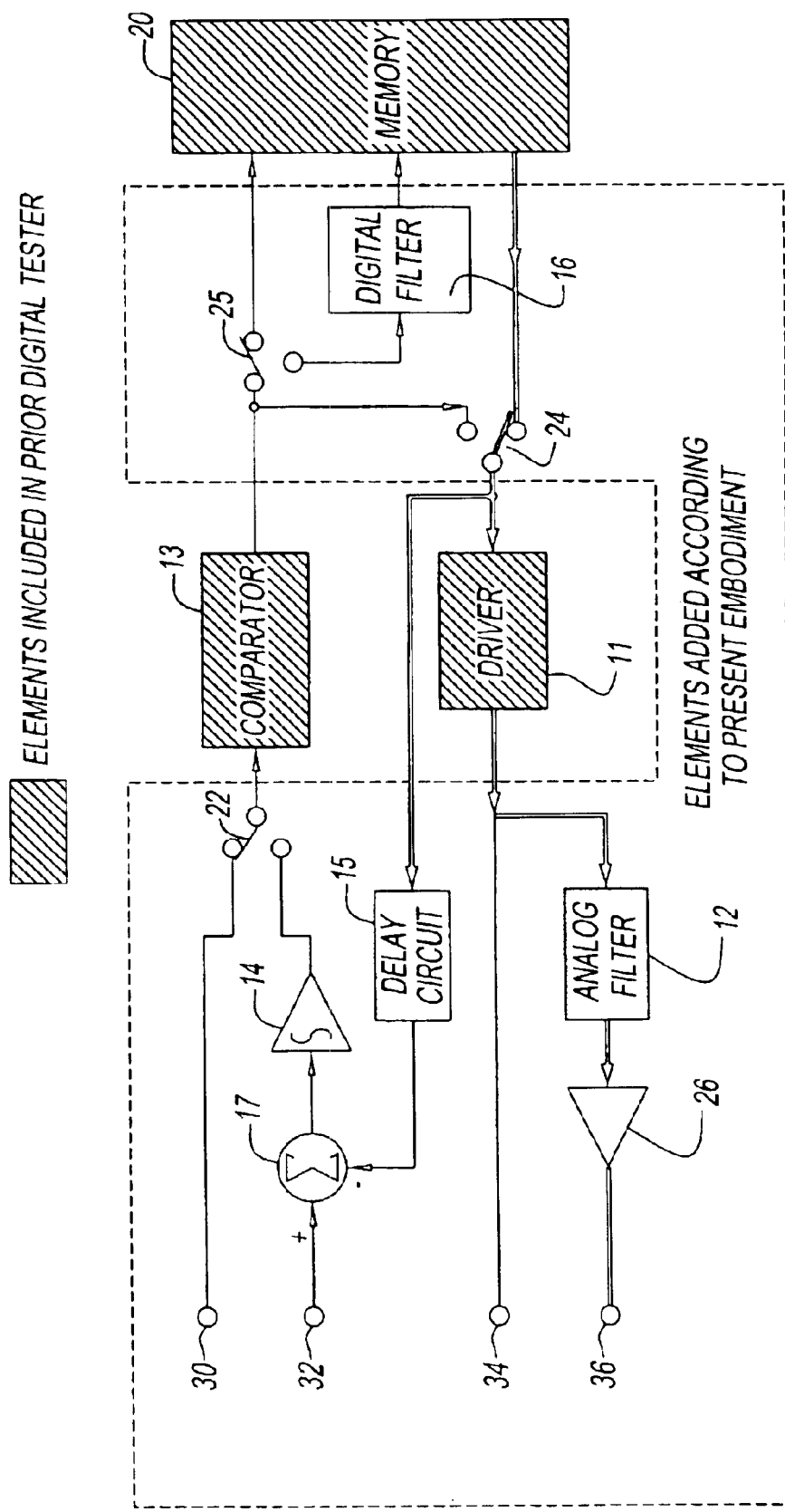
FIG. 5 is a block diagram showing the manner in which the measuring system shown in FIG. 2 operates when an analog signal is outputted therefrom.

For outputting an analog output signal, the switch 24 is operated to transmit test data stored in the memory 20 via the driver 11, the analog filter 12, and an amplifier 26 to an analog output terminal 36, as shown in FIG. 5. The switch 22 is operated to prevent the analog input signal from the IC device under test from being transmitted from the analog input terminal 32 to the memory 20.

Figure 6:
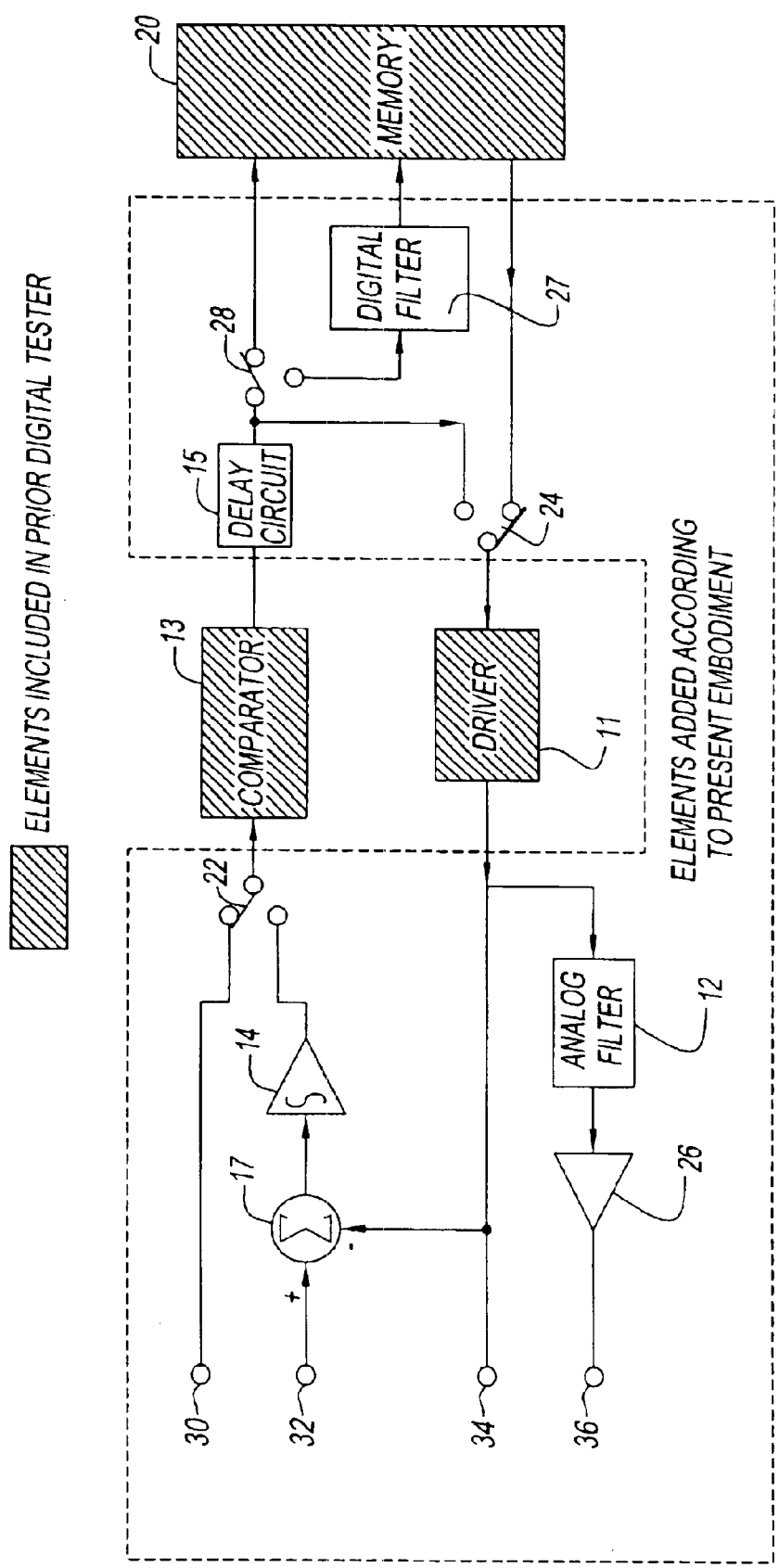
FIG. 6 is a block diagram of a measuring system according to a second embodiment of the present invention, which further includes functions of a switch and a digital filter that are added to the measuring system shown in FIG. 2.
Figure 8:
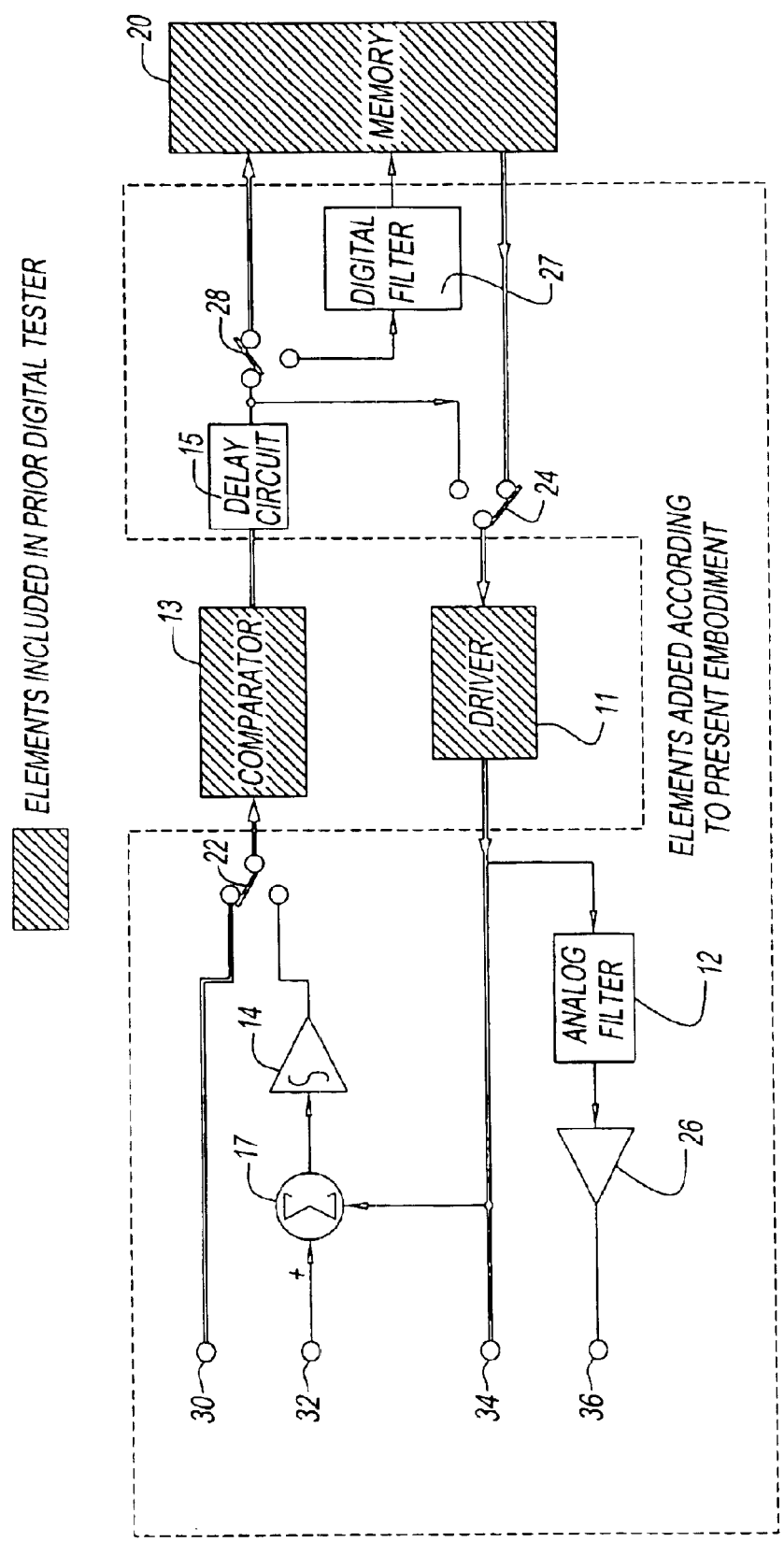
FIG. 8 is a block diagram showing the manner in which the measuring system shown in FIG. 6 operates when a digital signal is inputted thereto and outputted therefrom.
Figure 9:
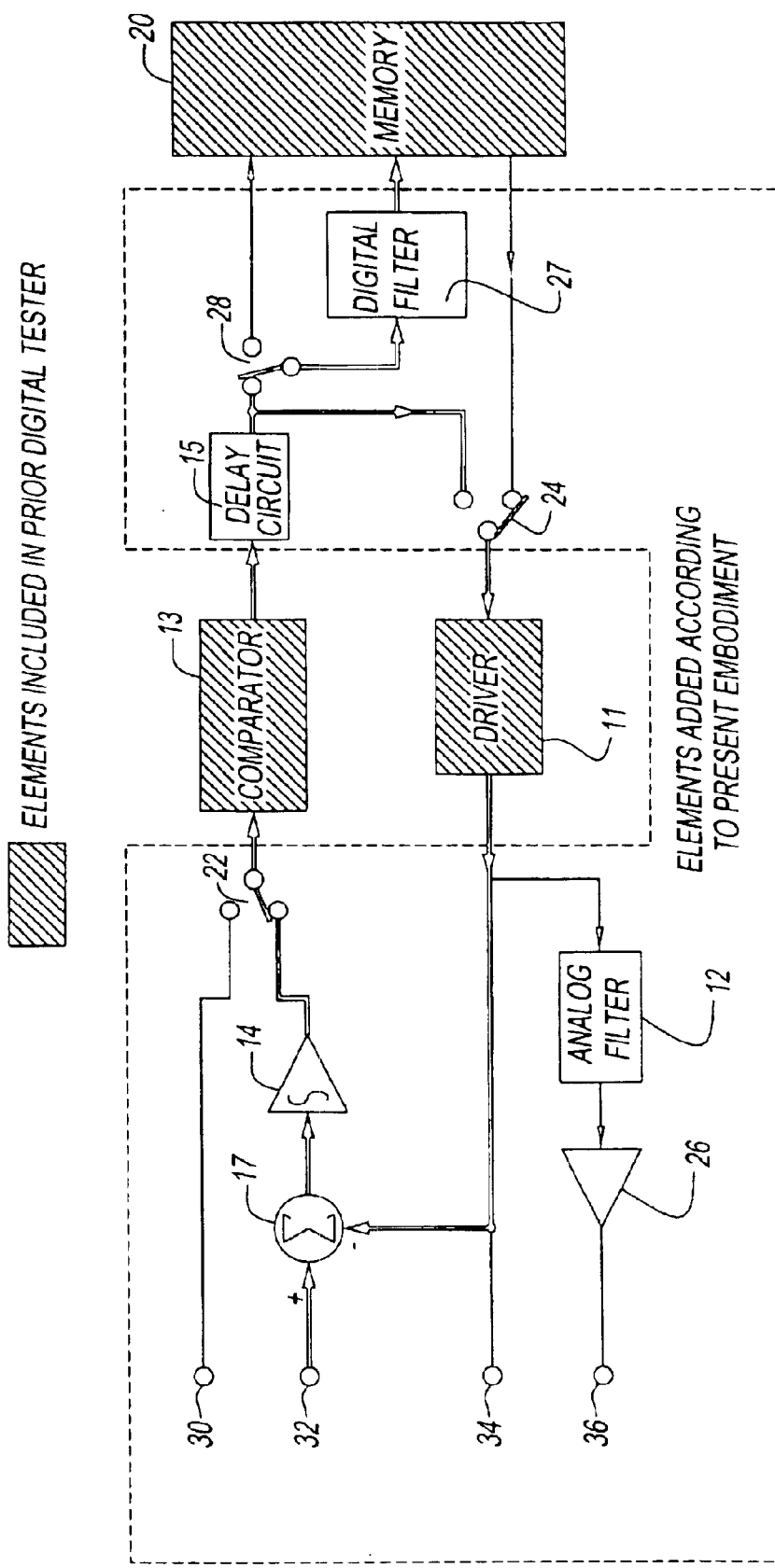
FIG. 9 is a block diagram showing the manner in which the measuring system shown in FIG. 6 operates when an analog signal is inputted thereto.
Figure 10:
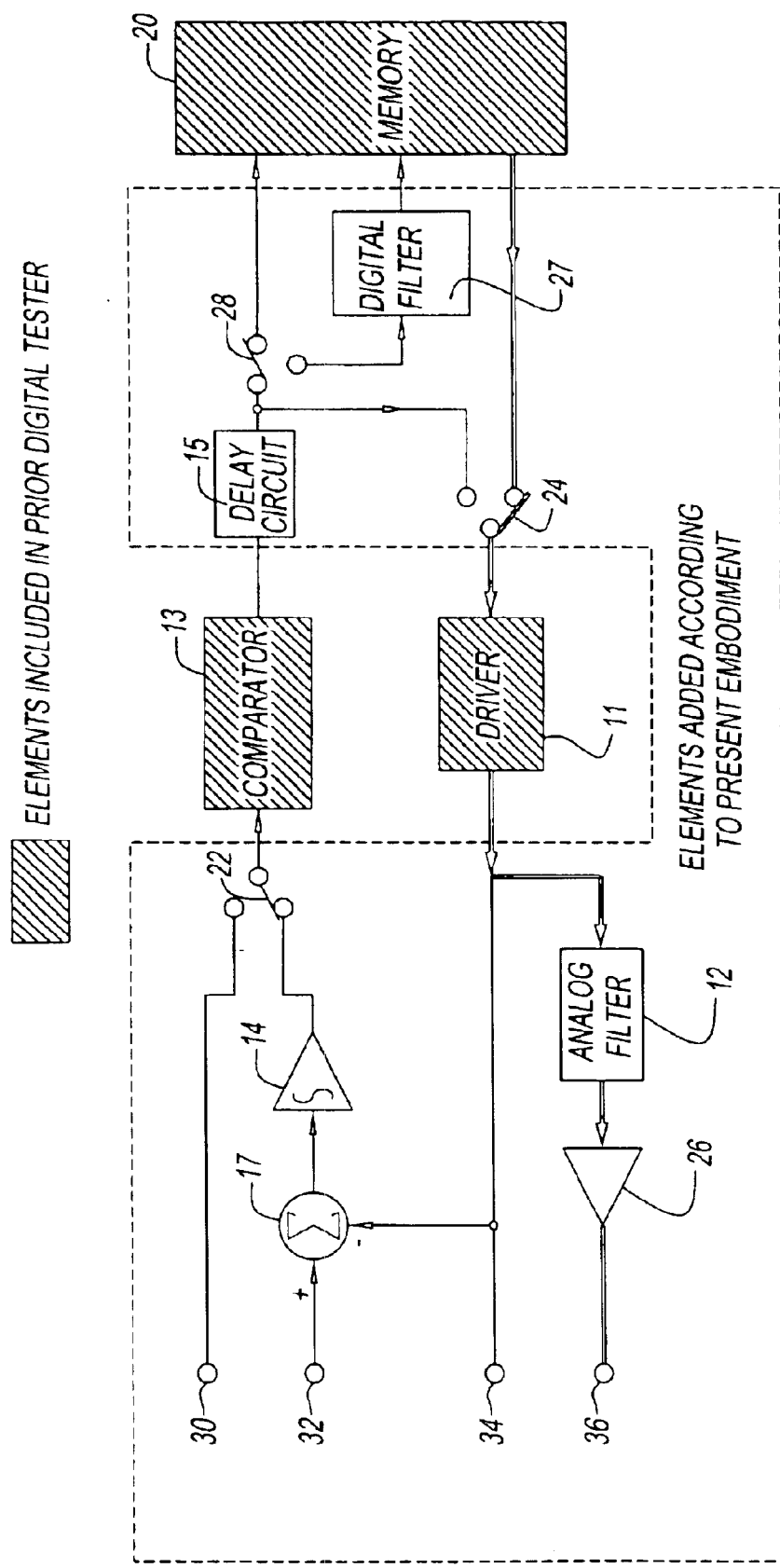
FIG. 10 is a block diagram showing the manner in which the measuring system shown in FIG. 6 operates when an analog signal is outputted therefrom.

A measuring system according to a second embodiment of the present invention will be described below with reference to FIG. 6. Operation of the measuring system according to the second embodiment when an analog signal is outputted therefrom as shown in FIG. 10 and when a digital signal outputted therefrom and inputted thereto as shown in FIG. 8 is the same as the operation of the measuring system according to the first embodiment, and will not be described below. For receiving an analog input signal, as shown in FIG. 9, an output signal from the comparator 13 is supplied to the delay circuit 15, which produces two divided output signals. One of the output signals from the delay circuit 15 is supplied to a digital filter 27, whereas the other output signal from the delay circuit 15 is supplied to the driver 11. The adder 17 and the integrator 14 are added to provide a ΔΣ A/D converter. The measuring system according to the second embodiment differs from the measuring system according to the first embodiment in that the driver 11 provided in a circuit for a standard digital signal is used as a component of the A/D converter. To achieve such an arrangement, it is necessary to design the measuring system to provide a signal path which includes the driver 11 in a feedback loop from the comparator 13 to the adder 17.

The amplitudes of the analog input and output signals can easily be adjusted by varying an output voltage range of the driver 11. The amplitudes of the analog input and output signals can be made more accurate by employing a differential analog circuit or modulating the output signal from the driver when the analog signal is inputted and outputted.

In the above embodiments, the integrator 14 should preferably comprise an integrator of a high order such as a second order or higher. However, the integrator 14 may comprise an integrator of a first order. The memory may be in the form of a plurality of memories dedicated for different operational modes, i.e., for outputting a digital signal and inputting an analog signal, or a plurality of memory areas allotted respectively to such different operational modes. With the latter memory area allocation scheme, the memory areas may be allotted with or without limitations or may be allotted dynamically or statically.

The present invention allows a single testing apparatus to test both digital and analog signals. For testing analog signals, a plurality of performance tests having different frequency bands and different resolutions may be carried out. As a result, even if there are many devices to be measured and many items to be measured, the test can be carried out with a minimum number of apparatuses. The principles of the present invention are also applicable to multisite tests in which a plurality of devices are simultaneously measured for the purpose of reducing the test cost.

Since the number of types of hardware to be manufactured can be reduced according to the present invention, the cost of parts and the cost required to prepare replacements can be reduced. Furthermore, a measuring system capable of handling both analog and digital signals can be realized at a low cost by adding simple components such as an adder, an integrator, and switches.

The entire disclosure of Japanese Patent Application No. 2001-98038 filed on Mar. 30, 2001 including the specification, claims, drawings and summary are incorporated herein by reference in its entirety.

What is claimed is:

1. An apparatus for testing an integrated circuit of a device under test by monitoring an analog signal and a digital signal outputted from the integrated circuit, comprising:

a comparator;

a memory for receiving an output signal from said comparator;

a driver for receiving an output signal from said memory;

an adder or subtractor that accepts the analog signal outputted from the integrated circuit and, selectively, the signal outputted from said driver;

an integrator which accepts an analog signal outputted from said adder or subtractor;

a first switch for selectively transmitting an analog signal outputted from said integrator and the digital signal outputted from said integrated circuit to said comparator; and a second switch for selectively transmitting the signal from said memory and the outputted signal from said comparator to said driver, wherein at least one of said switches is operated depending on whether a signal to be tested is analog or digital.

2. An apparatus according to claim 1, further comprising a third switch and a digital filter which are connected between said comparator and said memory, for transmitting the outputted signal from said comparator selectively via said digital filter to said memory.

3. An apparatus according to claim 1, further comprising a delay circuit connected between said comparator and said adder or said subtractor.

4. An apparatus according to claim 1, further comprising a delay circuit connected between said comparator and said second switch.

* * * * *